US006970037B2

(12) United States Patent
Sakhuja et al.

(10) Patent No.: US 6,970,037 B2
(45) Date of Patent: Nov. 29, 2005

(54) PROGRAMMABLE ANALOG BIAS CIRCUITS USING FLOATING GATE CMOS TECHNOLOGY

(75) Inventors: Shashi B. Sakhuja, Saratoga, CA (US); Ilie Marian Poenaru, Bucharest (RO)

(73) Assignee: Catalyst Semiconductor, Inc., Sunnyvale, CA (US)

(*) Notice: Subject to any disclaimer, the term of this patent is extended or adjusted under 35 U.S.C. 154(b) by 0 days.

(21) Appl. No.: 10/656,982

(22) Filed: Sep. 5, 2003

(65) Prior Publication Data

US 2005/0052223 A1 Mar. 10, 2005

(51) Int. Cl.[7] ......................... G11C 11/40; H01L 27/00
(52) U.S. Cl. ......................... 327/566; 327/89; 327/543
(58) Field of Search ................................ 327/434, 541, 327/543, 566, 77, 78, 89; 365/185.21, 185.28; 257/314, 315, 322

(56) References Cited

U.S. PATENT DOCUMENTS

| | | | | |
|---|---|---|---|---|
| 5,309,009 | A | 5/1994 | Chao | 257/318 |
| 5,495,453 | A | 2/1996 | Wociechowski et al. | |
| 5,740,106 | A * | 4/1998 | Nazarian | 365/185.1 |
| 5,901,085 | A | 5/1999 | Kramer et al. | |
| 5,963,084 | A | 10/1999 | Eschauzier | 327/553 |
| 6,028,335 | A * | 2/2000 | Okamoto et al. | 257/314 |
| 6,133,780 | A | 10/2000 | Chi | 327/541 |
| 6,297,689 | B1 | 10/2001 | Merrill | 327/540 |
| 6,411,549 | B1 * | 6/2002 | Pathak et al. | 365/185.2 |
| 6,414,536 | B1 | 7/2002 | Chao | 327/540 |
| 6,532,170 | B1 * | 3/2003 | Madurawe et al. | 365/185.1 |

OTHER PUBLICATIONS

Harrison et al.: "A CMOS :Programmable Analog Memory-Cell Array Using Floating Gate Circuits"; IEEE 2001; IEEE Transactions On Circuits And Systems-II: Analog And Digital Signal Processing, vol. 48, No. 1, Jan. 2001. pp. 4-11.

* cited by examiner

*Primary Examiner*—Timothy P. Callahan
*Assistant Examiner*—Terry L. Englund
(74) *Attorney, Agent, or Firm*—Bever, Hoffman & Harms, LLP; E. Eric Hoffman

(57) ABSTRACT

A voltage reference circuit includes storage, programming, and test floating gate transistors. The floating gates of the storage and programming transistors are shorted, while the floating and control gates of the test transistor are shorted. The test and storage transistors are connected between an input terminal and the inputs of a comparator, with the control gate of the test transistor also being connected to the input terminal. A reference voltage is programmed by applying the reference voltage to the input terminal and increasing the net positive charge on the floating gate of the storage transistor (via the programming transistor) until its source voltage matches the source voltage of the test transistor. Then, any test voltage at the input terminal can be compared to the programmed reference voltage by comparing the source voltages of the test and storage transistors.

30 Claims, 4 Drawing Sheets

PROGRAMMABLE ANALOG BIAS CIRCUITS USING FLOATING GATE CMOS TECHNOLOGY

BACKGROUND OF THE INVENTION

1. Field of the Invention

The invention relates to integrated circuits, and in particular, to a compact, stable, and accurate reference voltage generator.

2. Related Art

A voltage reference circuit in an integrated circuit (IC) provides a reference voltage for use by other elements in the IC. A bandgap reference generator, which is the most commonly used type of voltage generator, bases its reference voltage on the bandgap voltage of the semiconductor material on which the bandgap reference generator is formed. For example, a bandgap reference generator formed on silicon will produce a reference voltage roughly equal to the bandgap of silicon (1.21 V).

A bandgap reference generator generates a reference voltage Vref by combining the base-emitter voltage Vbe of a bipolar transistor with a proportional-to-absolute-temperature (PTAT) voltage Vt (i.e., Vt increases as temperature increases). Meanwhile, the base-emitter voltage Vbe has an inverse linear relationship with temperature (i.e., Vbe decreases as temperature increases). Therefore, by properly combining base-emitter voltage Vbe with PTAT voltage Vt, it is possible for a bandgap reference generator to produce a reference voltage Vref that is relatively stable across a wide range of temperatures.

Unfortunately, due to manufacturing variations and limitations, the actual output of a bandgap reference generator is often inaccurate (i.e., not at the desired reference voltage level) and/or unstable (e.g., excessively temperature-dependent). Compensation and correction circuitry for that non-ideal output can increase the area, complexity, and cost of ICs that include such bandgap reference generators.

Furthermore, because the reference voltage produced by a bandgap reference generator is fundamentally based on the bandgap of the underlying semiconductor material, the actual reference voltage produced by a bandgap reference generator cannot be easily set to a desired value. Once again, additional voltage adjustment circuitry is required to create a desired voltage from the reference voltage provided by the bandgap reference generator.

Accordingly, it is desirable to provide a simple, stable reference voltage generator that can be flexibly configured to provide a desired reference voltage.

SUMMARY OF THE INVENTION

According to an embodiment of the invention, a voltage reference circuit includes a storage transistor that uses a floating gate. A reference voltage is defined by charge stored on the floating gate of the storage transistor. Under normal operating conditions, the storage transistor can maintain that charge on its floating gate indefinitely (e.g., greater than 25 years at 55° C.).

Because the reference voltage is defined by a particular quantity of charge rather than by a temperature-dependent bandgap voltage, this reference voltage can be more stable than that provided by conventional bandgap reference generators. Furthermore, the reference voltage can be altered to any desired value by simply regulating the amount of charge programmed onto the floating gate.

According to an embodiment of the invention, the reference voltage circuit further includes a test transistor and a programming transistor, both of which are formed using the same floating gate process as the storage transistor. The test transistor is designed to match the dimensions and location of the storage transistor as closely as possible, except that the floating gate and control gate of the test transistor are electrically connected to each other. Meanwhile, the floating gate of the programming transistor is electrically connected to the floating gate of the storage transistor.

During programming of the storage transistor, a large voltage potential is applied across the floating gate of the programming transistor to cause electron tunneling off of the floating gate (or hole tunneling onto the floating gate), thereby raising the net positive charge on the floating gate. Since the floating gates of the programming and storage transistors are electrically connected, the storage transistor also sees this increase in net positive charge on its floating gate.

The sources of the storage transistor and the test transistor are connected to the inputs of a comparator, while the gate and drain of the test transistor are shorted and connected to a reference input terminal. Because the floating gate of the test transistor is electrically connected to its control gate, the test transistor behaves like a regular (non-floating gate) transistor. Therefore, when a reference voltage (i.e., the desired voltage to be stored) is applied to the reference input terminal, the test transistor provides a source voltage to the comparator that is equal to the reference voltage minus the threshold voltage of the test transistor.

Meanwhile, the storage transistor starts off providing a low source voltage to the comparator, but as the net positive charge builds up on the floating gate of the storage transistor, the threshold voltage of the storage transistor decreases, which in turn increases the source voltage of the storage transistor. When the comparator detects that the potential difference between the source of the storage transistor and the source of the test transistor has reached zero, the high programming voltage is decoupled from the programming transistor. Thereafter, no additional positive charge is placed on the floating gates of the programming transistor, and hence, the storage transistor.

In this manner, the reference voltage is stored in the reference voltage circuit. Then, to compare a test voltage to the stored reference voltage, the gate voltage of the storage transistor is set to the same gate voltage applied during the programming operation, and the test voltage is applied to the reference input terminal. The comparator can then compare the source voltages of the storage and test transistors to determine the relative magnitudes of the target and test voltages. For example, if the source voltage of the storage transistor is greater than the source voltage of the test transistor, the test voltage must be less than the target voltage, and vice versa.

These and other aspects of the invention will be more fully understood in view of the following description of the exemplary embodiments and the drawings thereof.

DETAILED DESCRIPTION

Figure 1:
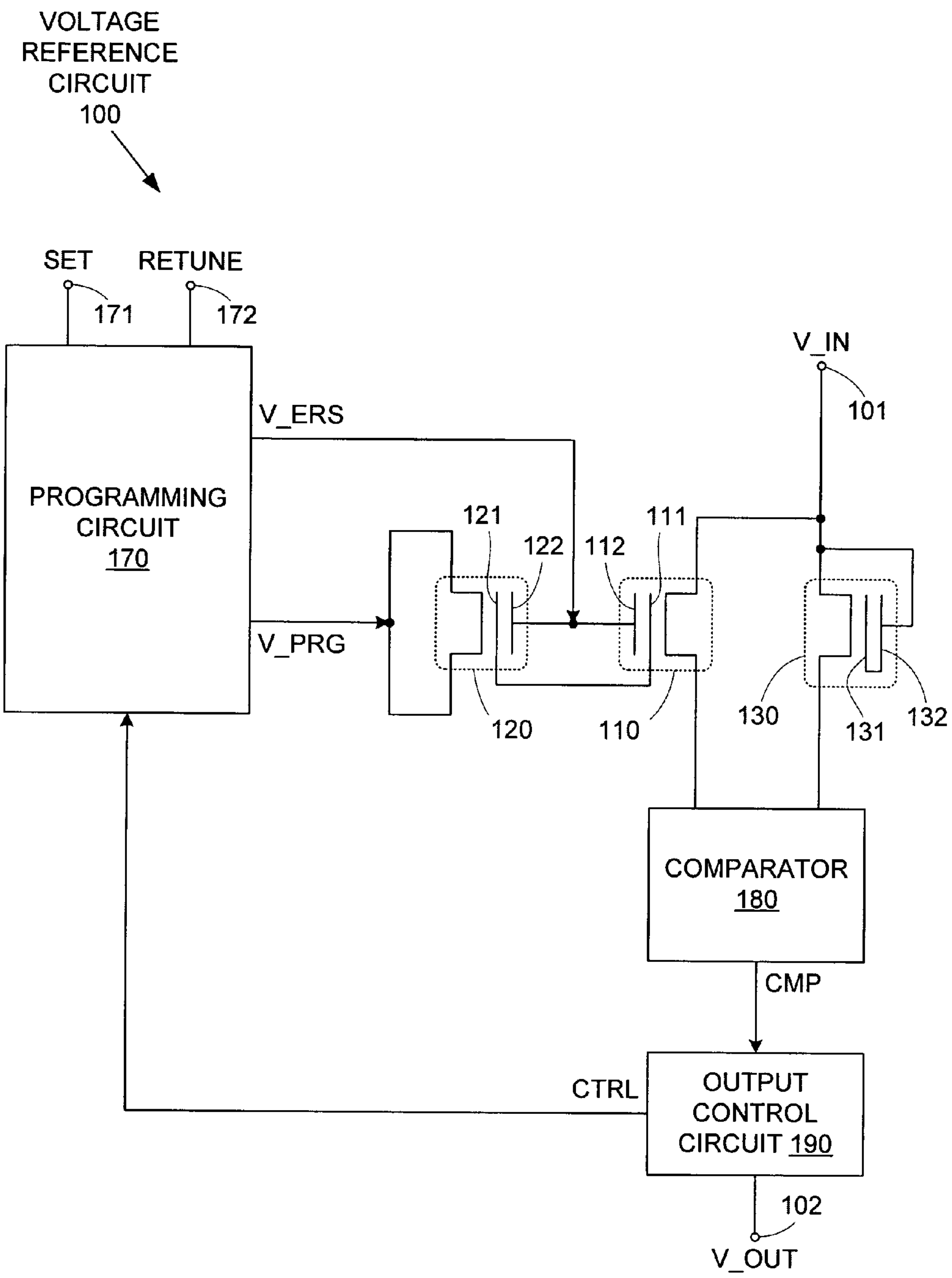
FIG. 1 is a circuit diagram of a voltage reference circuit in accordance with an embodiment of the invention.

FIG. 1 shows a circuit diagram of a voltage reference circuit 100 that includes a storage transistor 110, a programming transistor 120, a test transistor 130, a programming circuit 170, a comparator circuit 180, and an output control circuit 190. Storage transistor 110 includes a floating gate 111 and a control gate 112. Programming transistor 120 includes a floating gate 121 and a control gate 122. Test transistor 130 includes a floating gate 131 and a control gate 132.

Transistors 110, 120, and 130 can all be fabricated using the same processes (e.g., with floating gates 111, 121, and 131 being formed by a first polysilicon process ("poly 1") and control gates 112, 122, and 132 being formed by a second polysilicon process ("poly 2")). Note that while transistors 110, 120, and 130 are depicted as n-type transistors for exemplary purposes, according to various other embodiments of the invention, transistors 110, 120, and 130 can comprise any combination of n-type and p-type transistors (although storage transistor 110 and test transistor 130 will always be of the same type).

Floating gate 111 of storage transistor 110 is electrically connected (i.e., tied by a conductive path) to floating gate 121 of programming transistor 120. Therefore, storage transistor 110 and programming transistor 120 share a common floating gate voltage. Meanwhile, control gate 112 of storage transistor 110 is electrically connected to control gate 122 of programming transistor 120, so that both control gates receive the same control voltage from programming circuit 170. Finally, floating gate 131 and control gate 132 of test transistor 130 are electrically connected together (e.g., by a metal interconnect), so that any voltage applied to control gate 132 is automatically applied to floating gate 131.

To optimize the accuracy and stability of the reference voltage stored by voltage reference circuit 100, it is desirable that storage transistor 110 and test transistor 130 have substantially similar performance characteristics. Therefore, according to an embodiment of the invention, transistors 110 and 130 are "matched" transistors. A set of transistors are typically matched by making them dimensionally similar and positioning them in close proximity with one another.

Note that transistors 110 and 130 can be matched even though their floating gate configurations are somewhat different, since the performance of the transistors is determined by their gate (floating and control) dimensions and channel dimensions. If the transistors 110 and 130 are produced using the same semiconductor processes, have similar gate and channel dimensions, and are positioned relatively close to one another, their electrical performances should be quite similar.

Each of storage transistor 110 and test transistor 130 is connected between an input terminal 101 and an input of comparator 180. Control gate 132 of test transistor 130 is also electrically connected to input terminal 101. Because control gate 132 is electrically connected to floating gate 131, test transistor 130 simply behaves like a regular (non-floating gate) transistor. Note that, according to another embodiment of the invention, test transistor 130 can be implemented as a regular transistor. However, the use of the tied floating gate/control gate structure shown in FIG. 1 can allow better matching of test transistor 130 to storage transistor 110, since the two transistors can be formed using the same process steps.

Comparator 180 compares the source voltage of storage transistor 110 to the source voltage of test transistor 130 to generate a comparator output signal CMP. Output control circuit 190 then uses comparator output signal CMP to provide an output signal V_OUT and/or provide a control signal CTRL to programming circuit 170.

Programming circuit 170 includes input terminals 171 and 172, and sets the level of a programming voltage V_PRG and an erase voltage V_ERS based on the states of a programming signal SET and an erase signal RETUNE provided to input terminals 171 and 172, respectively. Programming circuit 170 provides programming voltage V_PRG to the commonly coupled source and drain of programming transistor 120, and provides erase voltage V_ERS to the commonly coupled control gates 122 and 112 of programming transistor 120 and storage transistor 110, respectively. During programming operations, the behavior of programming control circuit 170 is additionally controlled by control signal CTRL.

Prior to any programming operation, a reset operation can be performed to bring storage transistor 110 to a desired "unprogrammed" state. Typically, this unprogrammed state would be one in which floating gate 111 has no net positive charge. Note that, according to various other embodiments of the invention, the net charge on floating gate 111 in the unprogrammed state of storage transistor 110 can be either positive or negative, depending on the voltage levels to be stored by reference voltage circuit 100.

To perform a reset operation, erase signal RETUNE is asserted at input terminal 172 of programming circuit 170. This causes programming circuit 170 to raise erase voltage V_ERS to a high erase voltage while simultaneously setting programming voltage V_PRG to a low level (typically zero). The erase voltage is selected to be high enough that the net positive charge on floating gate 121 of programming transistor 120 is reduced—for example, via electrons tunneling from the substrate into floating gate 111, thereby canceling out any positive charge on floating gate 111.

Note that while electron tunneling to and from floating gate 121 is described for exemplary purposes, any charge carriers and any charge transfer mechanism could be used to adjust the net charge on floating gate 121. For example, the tunneling of holes from floating gate 121 into the substrate could be the process used to decrease the net positive charge on floating gate 121. Alternatively, hot electron injection could be used to inject electrons into floating gate 111.

To program a target reference voltage Vref into voltage reference circuit 100, voltage V_IN at input terminal 101 is set equal to voltage Vref. Meanwhile, programming signal SET is asserted, thereby causing programming circuit 170 to set programming voltage V_PRG to a high charging voltage while simultaneously setting erase voltage V_ERS equal to a low voltage (e.g., zero volts). The resulting strong electric field between the source/drain and control gate of programming transistor 120 causes a buildup of positive charge on floating gate 121—for example, by causing electrons from floating gate 121 to tunnel into the substrate, thereby increasing the voltage (net positive charge) on floating gate 121.

Note that the specific value of the charging voltage for this programming operation will depend on the particular characteristics of programming transistor 120. For example, if programming transistor 120 is formed using a 0.5 $\mu$m process, the charging voltage required for tunneling can be in the range of 10–12V (i.e., V_PRG=10–12V). Note further that the erase voltage used during the reset operation described above and the charging voltage can be equal to the same voltage.

So long as programming voltage V_PRG remains at the high charging voltage and erase voltage V_ERS remains at zero, the net positive charge on floating gate 121 will continue to increase. Furthermore, because floating gate 121 of programming transistor 120 is electrically connected to floating gate 111 of storage transistor 110, floating gate 111 will see this same voltage increase.

During the programming operation, comparator 180 compares the source voltage of storage transistor 110 to the source voltage of test transistor 130. As the floating gate voltage of storage transistor 110 increases, the threshold voltage of storage transistor 110 decreases. This in turn increases the source voltage of storage transistor 110 seen by comparator 180, since the source voltage of a transistor is equal to its gate voltage minus its threshold voltage.

Thus, during the initial stages of a programming operation, the source voltage of test transistor 130 will be higher than the source voltage of storage transistor 110, since the gate voltage of test transistor 130 is at reference voltage Vref (provided as input voltage V_IN). As a result, comparator 180 sets output signal CMP to a first state indicating that the stored voltage in voltage reference circuit 100 is less than the reference voltage Vref.

For example, assume that the threshold voltages of test transistor 130 and storage transistor 110 are both equal to 0.8V, and that reference voltage Vref is equal to 3.8V. Then, at the start of programming, the source voltage of test transistor 130 will be equal to 3.0V (3.8V–0.8V), while the source voltage of storage transistor 110 will be equal to −0.8V (0V–0.8V). Comparator 180 will therefore generate output signal CMP in the first state.

As the programming operation (described above) continues, the net positive charge on floating gate 111 of storage transistor 110 increases, thereby decreasing the threshold voltage of storage transistor 110 and increasing the source voltage of transistor 110. When the source voltage of storage transistor 110 matches the source voltage of test transistor 130, comparator 180 sets output signal CMP to a second state indicating that the stored voltage has reached the reference voltage Vref.

Returning to the example described above, when the positive charge on floating gate 111 reaches a level that causes storage transistor 110 to have a threshold voltage equal to −3.0V, the source voltage of storage transistor 110 will be equal to 3.0V (0V–(−3.0V)). At that point, comparator 180 will switch output signal CMP to the second state.

In response to this change in state of signal CMP, output control circuit 190 asserts control signal CTRL, which instructs programming circuit 170 to remove programming voltage V_PRG from the source/drain regions of transistor 120, thereby stopping the programming operation. In this manner, the reference voltage Vref can be programmed into voltage reference circuit 100 by adjusting the threshold voltage of storage transistor 110. Note that any desired voltage can be stored in this manner by providing that voltage as input voltage V_IN during the programming operation.

Once the desired voltage has been programmed into voltage reference circuit 100, both programming signal SET and erase signal RETUNE are held LOW, thereby forcing both programming voltage V_PRG and erase voltage V_ERS to low voltage levels (e.g., zero volts). Therefore, the conditions for charge transfer to and from floating gate 121 of programming transistor 120 are removed, and the net charge on floating gate 121 (and on the floating gate 111 coupled thereto) is fixed. As is well known in the art, this charge can be retained for extremely long periods of time by floating gate transistors 110 and 120 (absent any anomalous conditions such as extremely high temperatures or exposure to high radiation levels).

During a subsequent comparison operation (i.e., comparing an input voltage V_IN to the stored reference voltage Vref), programming voltage V_PRG and erase voltage V_ERS are both held at a low voltage level by programming circuit 170. In particular, erase voltage V_ERS is held at the same low voltage level (e.g., zero volts) that was used during the programming operation.

As a result, the source voltage of storage transistor 110 is held at a level corresponding to the source voltage of test transistor 130 when input voltage V_IN is equal to reference voltage Vref. If input voltage V_IN is greater than or less than reference voltage Vref, the source voltage of test transistor 130 will be greater than or less than, respectively, the source voltage of storage transistor 110.

For example, using the sample voltage and threshold values described above with respect to the programming operation, during a comparison operation the source voltage of storage transistor will be equal to 3.0V (0V gate voltage minus −3.0V threshold voltage). The source voltage of test transistor 130 will be equal to input voltage V_IN minus 0.8V (the threshold voltage of transistor 130). The source voltages of transistors 110 and 130 can then be compared by comparator 180 to determine the relative magnitudes of input voltage V_IN and stored reference voltage Vref.

For instance, if input voltage V_IN is 4.0V, the source voltage of transistor 130 will be 3.2V (4.0–0.8V). Therefore, comparator 180 will place output signal CMP in the first state to indicate that the source voltage of test transistor 130 is greater than the source voltage of storage transistor 110. If input voltage V_IN is 2.0V, the source voltage of transistor 130 will be 1.2V (2.0V–0.8V), and comparator 180 will place output signal CMP in the second state to indicate that the source voltage of test transistor 130 is less than the source voltage of storage transistor 110.

Note that, according to another embodiment of the invention, comparator 180 could provide three different signals for when the source voltage of storage transistor 110 is greater than, less than, or equal to the source voltage of test transistor 130. In such a case, using the numbers from the above example, if input voltage V_IN is 3.8V, the source voltage of transistor 130 would be 3.0V (3.8V–0.8V), and comparator 180 would place output signal CMP in a third state to indicate that the source voltages of test transistor 130 and storage transistor 110 are equal.

Output control circuit 190 can then provide an appropriate output signal V_OUT based on signal CMP. Output signal V_OUT indicates whether input voltage V_IN is greater or less than the reference voltage stored by storage transistor 110. According to an embodiment of the invention, during normal operation of voltage reference circuit 100, output signal V_OUT simply tracks (i.e., is the same as) comparator output signal CMP.

Note that the termination of the programming operation involves a large voltage swing at the source/drain regions of programming transistor 120 as programming voltage V_PRG goes from the high programming voltage to zero. This activity is capacitively coupled to the floating gate of programming transistor 120, and therefore can adversely affect the behavior of storage transistor 110 (via connected floating gates 121 and 111).

Furthermore, due to propagation delays between the sensing circuitry of comparator 180 and programming circuit 170, the termination of the programming operation (i.e., the point at which programming circuit 170 removes the high programming voltage from the source/drain regions of programming transistor 120) can occur some time after comparator 180 senses that the voltage on floating gate 111 storage transistor has reached the reference voltage Vref. Therefore, the actual voltage stored on floating gate 111 can overshoot the target reference voltage Vref.

Therefore, according to an embodiment of the invention, these issues can be addressed by configuring programming transistor 120 such that the capacitance between floating gate 121 and control gate 122 (lower capacitance) is large compared to the capacitance between floating gate 121 and the source/drain regions of programming transistor 120 (upper capacitance). Because the ability of a capacitor to "smooth out" signals is proportional to its capacitance, increasing the lower capacitance of programming transistor 120 minimizes the effect of the above-described programming shutdown voltage swing.

Furthermore, as is known in the art, the voltage across a capacitor is proportional to the charge on the capacitor but inversely proportional to its capacitance ($V= q/C$). Therefore, increasing the lower capacitance relative to the upper capacitance reduces the rate at which the programming operation increases the floating gate voltage, thereby reducing the effect of any excess charging time resulting from propagation delays in voltage reference circuit 100.

Figure 2:
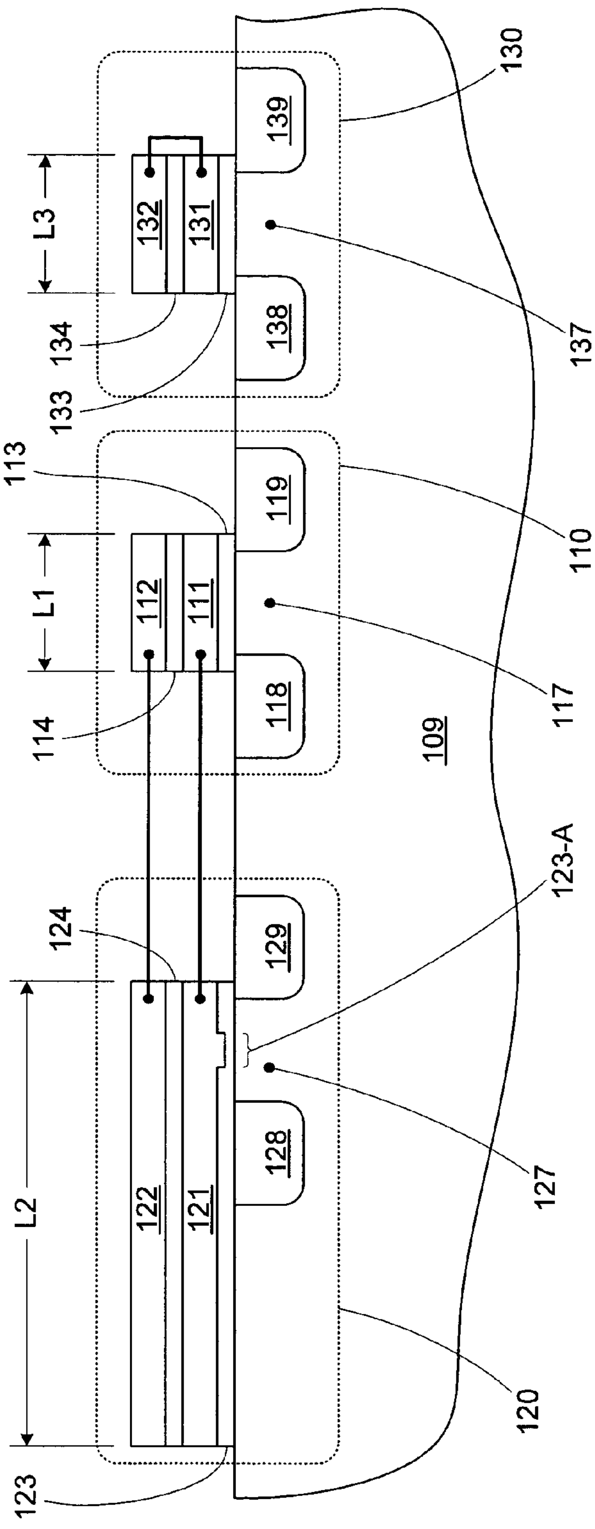
FIG. 2 is a cross-sectional diagram of storage, programming, and test transistors in accordance with another embodiment of the invention.

Since capacitance is proportional to the area of the capacitive plates, the sizes (areas) of floating gate 121 and control gate 122 can be increased to increase the lower capacitance of programming transistor 120. FIG. 2 shows a cross section of transistors 110, 120, and 130 from voltage reference circuit 100 shown in FIG. 1, according to an embodiment of the invention.

Storage transistor 110 includes a source 118, a drain 119, a channel region 117 between source 118 and drain 119, a floating gate 111 over channel region 117, a control gate 112, and oxide layers 113 and 114 between channel region 117 and floating gate 111, and between floating gate 111 and control gate 112, respectively.

Test transistor 130 includes a source 138, a drain 139, a channel region 137 between source 138 and drain 139, a floating gate 131 over channel region 137, a control gate 132 over floating gate 131 (and electrically connected to floating gate 131), and oxide layers 133 and 134 between channel region 137 and floating gate 131, and between floating gate 131 and control gate 132, respectively. As described above, transistors 110 and 130 are matched transistors, and so have the same channel lengths LC1 and LC3, respectively, and the same physical gate lengths LP1 and LP3, respectively.

Like transistors 110 and 120, programming transistor 130 includes a source 128, a drain 129, a channel region 127 between source 128 and drain 129, a floating gate 121 above channel region 127 (and electrically connected to floating gate 111 of storage transistor 110), a control gate 122 above floating gate 121, and oxide layers 123 and 124 between channel region 127 and floating gate 121, and between floating gate 121 and control gate 122, respectively.

Therefore, floating gates 111, 121, and 131 can all be formed during one process step (e.g., poly-1) and control gates 112, 122, and 132 can all be formed during a second process step (e.g., poly-2). However, programming transistor 120 does not need to be matched to transistors 110 and 130, and can therefore have a channel length LC2 and a physical gate length LP2 that are sized to provide a desired relationship between the upper and lower capacitances of programming transistor 120.

The lower and upper capacitances of a floating gate transistor are determined in large part by the physical gate area and channel area, respectively, of that transistor. Typically, these two areas in any particular transistor are similar (e.g., transistors 110 and 130), so that the lower and upper capacitances are substantially similar.

However, programming transistor 120 in FIG. 2 has a physical gate length LP2 that is significantly greater than its channel length LC2. This disparity means that the physical gate area of transistor 120 is significantly larger than its channel area (assuming similar gate and channel widths). Consequently, the lower capacitance of transistor 120 is much greater than its upper capacitance. In this manner, programming transistor 120 can be configured to minimize the shutdown voltage swing coupling and charging overshoot issues described above with respect to FIG. 1.

Note that, while floating gate 121 and control gate 122 are depicted as extending beyond source 128 for exemplary purposes, floating gate 121 and control gate 122 could be sized in any manner that results in the control and floating gate area (physical gate area) being substantially larger (e.g., 2× or more) than the channel region between source region 128 and drain region 129 (channel area). For example, floating gate 121 and control gate 122 could also (or alternatively) be extended beyond drain region 129. Also, floating gate 121 and control gate 122 could be increased in width (e.g., beyond the active region of transistor 120).

Note further that according to an embodiment of the invention, oxide layer 123 of programming transistor 120 can also include a thinned section 123-A to provide a "tunneling window" for programming and erasing programming transistor 120. Thinned section 123-A allows charge carriers to more easily pass through oxide layer 123 to and from floating gate 121.

Figure 3A:
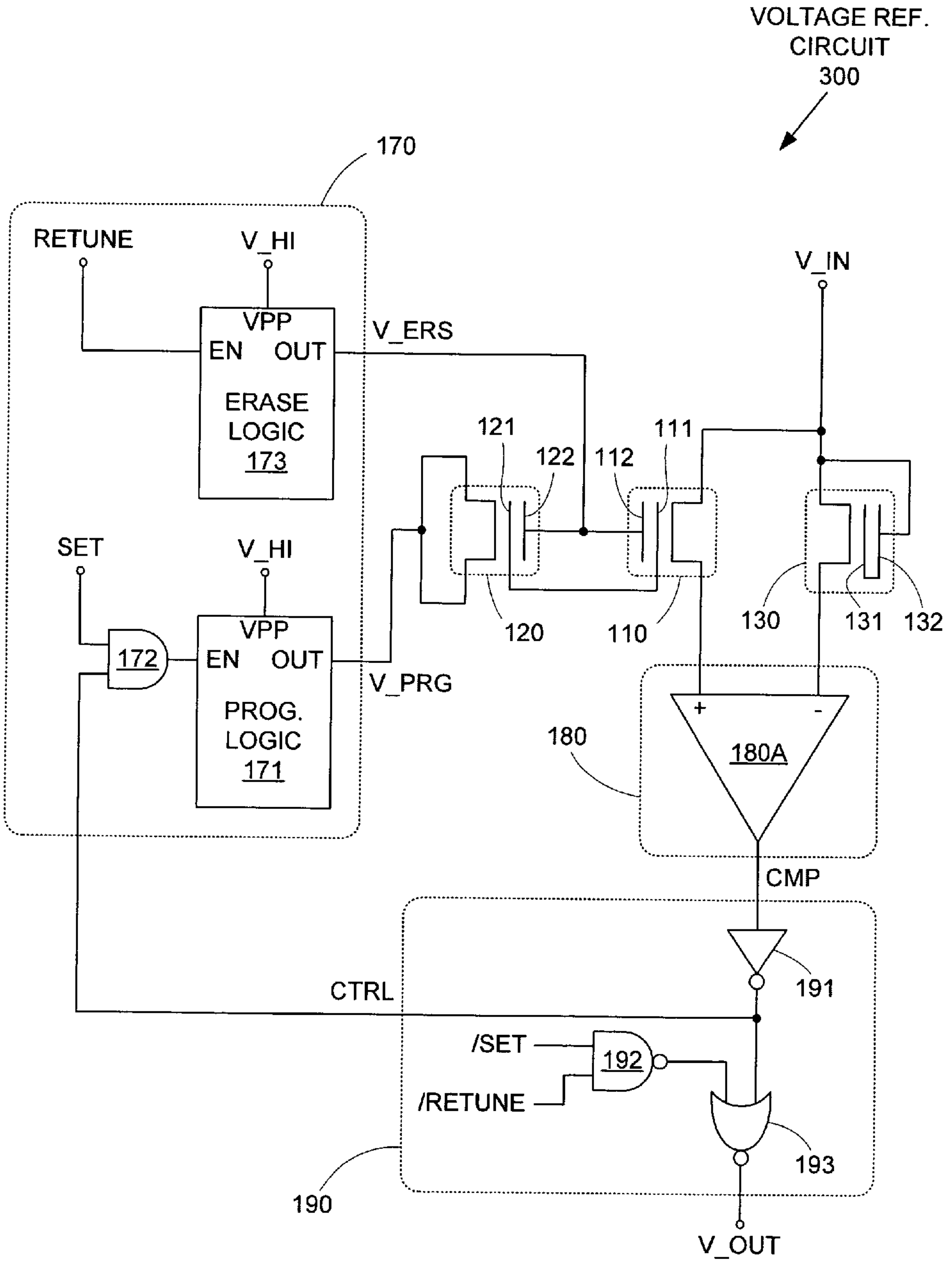
FIG. 3A is a circuit diagram of a voltage reference circuit in accordance with another embodiment of the invention.

FIG. 3A shows a voltage reference circuit 300, which is substantially similar to voltage reference circuit 100 shown in FIG. 1, but with sample circuit details depicted for programming circuit 170, comparator 180, and output control circuit 190, according to an embodiment of the invention.

For example, programming circuit 170 shown in FIG. 3 includes programming logic 171, an AND gate 172, and erase logic 173. AND gate 172 is coupled to receive programming signal SET and control signal CTRL, and programming logic 171 is coupled to receive the output of AND gate 172 and a high voltage V_HI and provide programming voltage V_PRG, while erase logic 173 is coupled to receive erase signal RETUNE and high voltage V_HI and provide erase voltage V_ERS.

Both programming logic 171 and erase logic 173 comprise an enable terminal EN, an input terminal VPP, and an output terminal OUT, and can therefore be identical circuits. For each circuit, a logic HIGH signal at enable terminal EN causes a voltage V_HI at input terminal VPP to be provided at output terminal OUT—otherwise the voltage at output terminal OUT remains low (e.g., zero). Voltage V_HI is the appropriate programming/erase voltage for programming transistor 120 (as described above with respect to FIG. 1).

Output control circuit 190 includes an inverter 191 coupled to receive comparator output signal CMP and provide control signal CTRL as an output, a NAND gate 192 coupled to receive as inputs signals /SET and /RETUNE (i.e., the complements of programming signal SET and erase signal RETUNE, respectively), and a NOR gate 193 coupled to receive as inputs the output of inverter 191 and the output of NAND gate 192, and provide output signal V_OUT as an output. Finally, comparator 180 includes a differential comparator 180A, which is described in greater detail below.

Figure 3B:
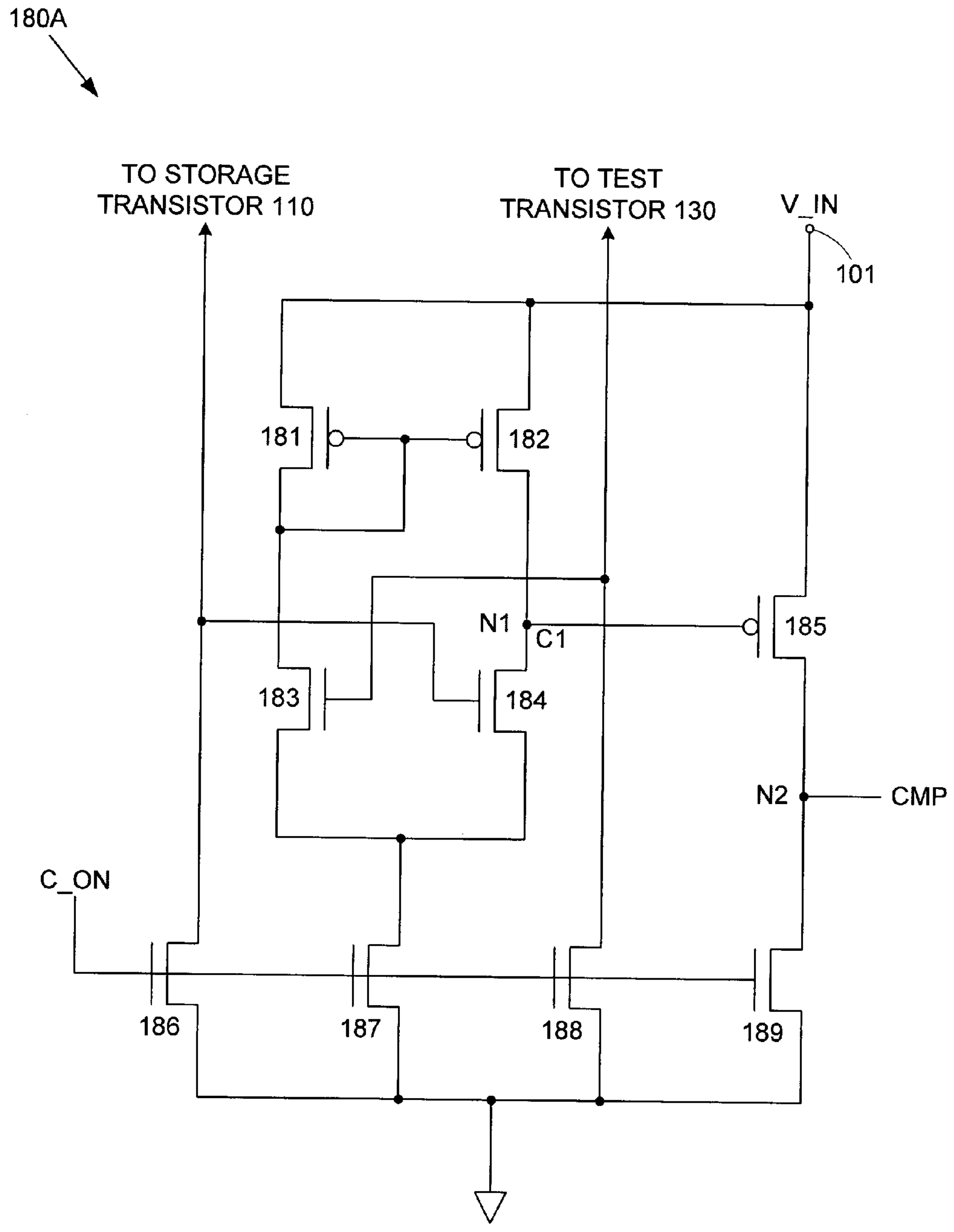
FIG. 3B is a circuit diagram of a comparator circuit the can be used in the voltage reference circuit of FIG. 3A, according to an embodiment of the invention.

FIG. 3B shows a circuit diagram of a differential comparator 180A for use with voltage reference circuit 300 of FIG. 3A. Differential comparator 180A includes p-type transistors 181, 182, and 185, and n-type transistors 183, 184, and 186–189. Transistors 181 and 183 are connected in series between input terminal 101 and transistor 187, while transistors 182 and 184 are connected in series between input terminal 101 and transistor 187. Transistor 186 is connected between storage transistor 110 (not shown) and ground, while transistor 188 is connected between test transistor 130 (not shown) and ground. Finally, transistors 185 and 189 are connected in series between input terminal 101 and ground. The gate of transistor 185 is connected to node N1 at the source of transistor 182, while the gates of transistors 186–189 are all connected to receive a compare signal C_ON. During a compare operation, the compare signal C_ON is asserted, thereby turning on transistors 186–189 and enabling comparator 180A.

The gate and source of transistor 181 are shorted, and the gates of transistors 181 and 182 are connected to form a current mirror. Therefore, the current flow through transistors 181 and 183 is equal to the current flow through transistors 182 and 184. Meanwhile, transistors 183 and 184 form a differential pair, so that an intermediate output C1 from node N1 is determined by the differential output from test transistor 130 and storage transistor 110—specifically, by the relative magnitudes of the source voltages of test transistor 130 and storage transistor 110 shown in FIG. 1.

For example, if the source voltage of test transistor 130 is greater than the source voltage of storage transistor 110 (i.e., input voltage V_IN is greater than stored reference voltage Vref), then the voltage at the gate of transistor 183 will be greater than the voltage at the gate of transistor 184, and intermediate output C1 will be HIGH. Therefore, transistor 185 will be turned off, and comparator output signal CMP at node N2 will be LOW.

On the other hand, if the source voltage of storage transistor 110 is greater than the source voltage of test transistor 130 (i.e., input voltage V_IN is less than stored reference voltage Vref), then the voltage at the gate of transistor 184 will be greater than the voltage at the gate of transistor 183, and intermediate output C1 will be LOW. Therefore, transistor 185 will be turned on, and comparator output signal CMP at node N2 will be HIGH.

Of course, the circuitry shown for comparator 180A is exemplary only. Alternatives may be found in the conventional art.

Returning to FIG. 3A, to perform a reset operation, erase signal RETUNE is asserted, which causes erase logic 173 to provide voltage V_HI at its output terminal OUT as voltage V_ERS (i.e., erase voltage V_ERS is set equal to voltage V_HI). Meanwhile, programming signal SET is held at a logic LOW state. Therefore, the output of AND gate 172 is also logic LOW, so that programming logic 171 holds its output terminal OUT at zero volts. The resulting high voltage potential between floating gate 121 and the source/drain regions of programming transistor 120 reduces the net positive charge on floating gate 121 (as described above).

During programming operations, erase signal RETUNE is deasserted, thereby causing erase logic 173 to set erase voltage V_ERS equal to zero volts. Meanwhile, programming signal SET is asserted, and is provided with control signal CTRL to the inputs of AND gate 172. As described above, control signal CTRL is the inverted output of comparator 180A. Since transistors 110 and 130 are connected to the positive and negative inputs, respectively, of differential comparator 180A, comparator output signal CMP is set to a logic HIGH state only when the output of storage transistor 110 is greater than the output of test transistor 130.

Thus, during the initial stages of a programming operation, the output of transistor 110 is lower than the output of transistor 130 (as described above) and comparator 180A sets signal CMP to a logic LOW state. Inverter 191 inverts this signal to generate a logic HIGH control signal CTRL. Therefore, the output of AND gate 172 corresponds to the logic HIGH state of programming signal SET, and programming logic 171 sets programming voltage V_PRG equal to the high voltage V_HI.

As soon as the source voltage of storage transistor 110 exceeds the source voltage of test transistor 130, comparator 180A switches the state of comparator output signal CMP to a logic HIGH level, which is inverted to a logic LOW control signal CTRL by inverter 191. This logic LOW signal switches the output of AND gate 172 to a logic LOW state, which in turn causes programming logic 171 to set programming voltage V_PRG equal to zero volts, thereby terminating the programming operation. As described above with respect to FIG. 1, the lower capacitance of programming transistor 120 can be increased relative to its upper capacitance to reduce the effects of this voltage swing by programming voltage V_PRG (from voltage V_HI to zero), and also to minimize any overshoot caused by propagation delays.

Note that, during programming and erase operations, either programming signal SET or erase signal RETUNE is at a logic HIGH level, so that at least one of complementary signals /SET and /RETUNE is at a logic LOW level. Therefore, the output of NAND gate 192 in output control circuit 190 is held at a logic HIGH level, which in turn results in the output of NOR gate 193 being held at a logic LOW level. Thus, during programming and reset operations, the output of voltage reference circuit 300 (i.e., output signal V_OUT) is effectively disabled.

However, during comparison operations of voltage reference circuit 300, both programming signal SET and erase signal RETUNE are held LOW, so that both programming logic 171 and erase logic 173 hold their outputs (programming voltage V_PRG and erase voltage V_ERS, respectively) at zero volts. Therefore, no charge is added to or removed from floating gate floating gate 121 of programming transistor 120, which in turn means that the voltage stored on floating gate 111 of storage transistor 110 remains constant.

Also, because signals SET and RETUNE are both LOW, signals /SET and /RETUNE provided to NAND gate 192 are both HIGH, thereby forcing the output of NAND gate 192 in output control circuit 190 to a logic LOW level. This results in the output of NOR gate 193 being the complement of the output of inverter 191—in other words, output signal V_OUT matches the state of comparator output signal CMP provided by comparator 180A. In this manner, during normal operation of voltage reference circuit 300, output signal V_OUT indicates whether an input voltage V_IN is greater or less than the reference voltage stored in reference voltage circuit 100.

The various embodiments of the structures and methods of this invention that are described above are illustrative only of the principles of this invention and are not intended to limit the scope of the invention to the particular embodiments described. Thus, the invention is limited only by the following claims and their equivalents.

What is claimed is:

1. An integrated circuit (IC) comprising:

a first transistor comprising a first floating gate and a first control gate;

a second transistor comprising a second floating gate and a second control gate, the second floating gate being electrically connected to the first floating gate; and a third transistor comprising a first gate and a second gate located over the first gate, the first gate being electrically connected to the second gate; and an input terminal, wherein a drain of the first transistor, a drain of the third transistor and the second gate of the third transistor are each coupled to the input terminal.

2. The IC of claim 1, wherein the first transistor and the third transistor are matched transistors.

3. The IC of claim 2, wherein a physical gate area of the second transistor is substantially larger than a channel area of the second transistor.

4. The IC of claim 1, wherein the second floating gate is formed on an oxide layer, and wherein a portion of the oxide layer is thinned to provide a programming window.

5. The IC of claim 1, further comprising:

a comparator, wherein the first transistor is connected between the input terminal and a first input of the comparator, and wherein the third transistor is connected between the input terminal and a second input of the comparator.

6. The IC of claim 5, wherein the second gate is connected to the input terminal, and wherein the first control gate is connected to the second control gate.

7. The IC of claim 6, wherein the second transistor further comprises a source and a drain, the source and drain being formed in a substrate, wherein the IC further comprises a programming control circuit configured to provide a first voltage to the source and the drain of the second transistor and provide a second voltage to the second control gate when a programming signal is asserted, wherein the first voltage and the second voltage are sized to cause charge transfer between the substrate and the second floating gate, and wherein the programming control circuit is further configured to provide the first voltage to the second control gate and provide the second voltage to the source and drain of the second transistor when a reset signal is asserted.

8. The IC of claim 7, further comprising an output control circuit configured to assert a control signal in response to a comparator output signal from the comparator indicating that an output from the first transistor is greater than an output from the third transistor, wherein the programming control circuit removes the first voltage from the source and the drain of the second transistor when the control signal is asserted.

9. The IC of claim 8, wherein the output control circuit is further configured to provide the comparator output signal as an indicator signal when neither the programming signal nor the reset signal is asserted.

10. A method for creating a reference voltage circuit, the method comprising:

forming a first transistor having a first floating gate and a first control gate;

forming a second transistor having a second floating gate and a second control gate;

electrically connecting the second floating gate to the first floating gate;

forming a third transistor having a first gate and a second gate located over the first gate;

electrically connecting the first gate to the second gate; and electrically connecting a drain of the first transistor, a drain of the third transistor and the second gate.

11. The method of claim 10, wherein forming the third transistor comprises matching the third transistor to the first transistor.

12. The method of claim 11, wherein forming the second transistor comprises sizing the second floating gate larger than the first floating gate.

13. The method of claim 10, wherein forming the second transistor comprises:

providing an oxide layer;

thinning a first portion of the oxide layer;

forming the second floating gate on the oxide layer.

14. The method of claim 10, wherein the first floating gate, the second floating gate, and the first gate are formed during a first polysilicon process step, and wherein the first control gate, the second control gate, and the second gate are formed during a second polysilicon process step.

15. A voltage reference circuit comprising:

an input terminal;

a first transistor having a first floating gate;

a second transistor having a first gate and a second gate located over the first gate, the second gate being electrically connected to the input terminal and the first gate; and a comparator, wherein the first transistor is connected between the input terminal and a first input of the comparator, and wherein the second transistor is connected between the input terminal and a second input of the comparator.

16. The voltage reference circuit of claim 15, wherein the first transistor and the second transistor are matched transistors.

17. The voltage reference circuit of claim 15, further comprising a third transistor having a second floating gate, the second floating gate being electrically connected to the first floating gate.

18. The voltage reference circuit of claim 17, wherein a physical gate area of the third transistor is substantially larger than a channel area of the third transistor.

19. The voltage reference circuit of claim 17, further comprising a programming control circuit configured to program the first transistor by applying a programming voltage to a source and a drain of the third transistor and applying a first offset voltage to a control gate of the third transistor, wherein the source and the drain of the third transistor are formed in a substrate, and wherein the programming voltage and the first offset voltage are sized to cause charge transfer between the substrate and the second floating gate.

20. The voltage reference circuit of claim 19, wherein the programming control circuit is further configured to erase the first transistor by applying an erase voltage to the a control gate of the third transistor and applying a second offset voltage to the source and the drain of the third transistor, the erase voltage and the second offset voltage being sized to cause charge transfer between the second floating gate and the substrate.

21. The voltage reference circuit of claim 15, wherein the first floating gate has a net charge that causes the first transistor to provide a first voltage to the first input terminal of the comparator when a second voltage is applied to a control gate of the first transistor, and wherein the second transistor provides the first voltage to the second input terminal of the comparator when a reference voltage is applied to the input terminal.

22. A method for comparing a test voltage to a reference voltage, the method comprising:

providing a charge on a floating gate of a first transistor, the charge being sized such that applying a first voltage to a control gate of the first transistor results in a source voltage of the first transistor being equal to a source voltage of a second transistor when the reference voltage is applied to a gate of the second transistor;

applying the first voltage to the control gate of the first transistor;

supplying the test voltage to the floating gate of the second transistor;

supplying the test voltage to a drain of the first transistor and to a drain of the second transistor; and comparing the source voltage of the first transistor to the source voltage of the second transistor, effectively comparing the test voltage to the reference voltage as represented by the charge provided on the floating gate.

23. The method of claim 22, wherein the first transistor and the second transistor are matched transistors.

24. The method of claim 22, wherein the first voltage is a ground voltage.

25. A method for programming a reference voltage into a storage transistor, the method comprising:

providing a programming potential across a first transistor to generate a net charge on a floating gate of the first transistor;

providing a second transistor, wherein a floating gate of the second transistor is connected to the floating gate of the first transistor;

supplying the reference voltage to a first gate of a third transistor, wherein the first gate of the third transistor is located over, and is electrically connected to a second gate of the third transistor;

supplying the reference voltage to a drain of the second transistor and to a drain of the third transistor; and removing the programming potential across the first transistor when an output of the second transistor becomes equal to an output of the third transistor, wherein the second transistor functions as the storage transistor which effectively stores the programmed reference voltage.

26. The method of claim 25, wherein the second transistor and the third transistor are matched transistors.

27. A method for comparing a test voltage to a reference voltage, the method comprising:

providing a first transistor having a first terminal coupled to a test voltage input terminal, a second terminal, a floating gate, and a control gate, providing a second transistor having a first terminal coupled to the test voltage input terminal, a second terminal, a first gate, and a second gate located over the first gate, wherein the first gate of the second transistor is electrically connected to the second gate of the second transistor;

providing a charge on the floating gate of the first transistor, the charge being sized such that when a first voltage is applied to the control gate of the first transistor, an output at the second terminal of the first transistor is equal to an output at the second terminal of the second transistor when the reference voltage is applied to the second gate of the second transistor;

applying the first voltage to the control gate of the first transistor;

supplying the test voltage via the test voltage input terminal; and comparing the output at the second terminal of the first transistor to the output at the second terminal of the second transistor, effectively comparing the test voltage to the reference voltage as represented by the charge provided on the floating gate.

28. The method of claim 27, wherein the first transistor and the second transistor are matched transistors.

29. The method of claim 27, wherein the first voltage is a ground voltage.

30. The method of claim 27, further comprising:

placing an output signal in a first state when the output at the second terminal of the first transistor is greater than the output at the second terminal of the second transistor, wherein the first state indicates that the reference voltage is greater than the test voltage; and placing the output signal in a second state when the output at the second terminal of the first transistor is less than the output at the second terminal of the second transistor, wherein the second state indicates that the reference voltage is less than the test voltage.

* * * * *